(12) United States Patent
Nam et al.

(10) Patent No.: US 7,589,006 B2
(45) Date of Patent: Sep. 15, 2009

(54) METHOD FOR MANUFACTURING SEMICONDUCTOR DEVICE

(75) Inventors: Ki-Won Nam, Kyoungki-do (KR);
Ky-Hyun Han, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 374 days.

(21) Appl. No.: 11/641,580

(22) Filed: Dec. 18, 2006

(65) Prior Publication Data
US 2008/0003732 A1  Jan. 3, 2008

(30) Foreign Application Priority Data

Jun. 30, 2006 (KR) .................. 10-2006-0060392
Nov. 28, 2006 (KR) .................. 10-2006-0118488

(51) Int. Cl.
*H01L 21/4763* (2006.01)

(52) U.S. Cl. .............. 438/595; 438/258; 438/734; 438/738; 438/E21.252

(58) Field of Classification Search ......... 438/593–595, 438/257–258, 734–738; 257/315; 434/257–258
See application file for complete search history.

(56) References Cited

U.S. PATENT DOCUMENTS

2006/0094216 A1*  5/2006  Nam .................. 438/595

FOREIGN PATENT DOCUMENTS

| KR | 2003-0049159 | 6/2003 |
| KR | 10-2004-0038049 | 5/2004 |
| KR | 10-2004-0060324 | 7/2004 |
| KR | 10-2005-0041263 | 5/2005 |
| KR | 10-2006-0023004 | 3/2006 |

* cited by examiner

*Primary Examiner*—Dung A. Le
(74) *Attorney, Agent, or Firm*—Blakely, Sokoloff, Taylor & Zafman LLP

(57) ABSTRACT

A method for manufacturing a semiconductor device includes forming a plurality of gate lines on a substrate, forming a first cell spacer on the gate lines, forming a second cell spacer on the first cell spacer, forming a buffer layer on the second cell spacer, and exposing the surface of the substrate by etching the buffer layer.

11 Claims, 4 Drawing Sheets

METHOD FOR MANUFACTURING SEMICONDUCTOR DEVICE

CROSS-REFERENCE TO RELATED APPLICATIONS

The present application contains subject matter related to the Korean patent application numbers KR 10-2006-0060392 and 10-2006-0118488, filed in the Korean Patent Office on Jun. 30, 2006 and Nov. 28, 2006, respectively, the entire contents of which being incorporated herein by reference.

BACKGROUND OF THE INVENTION

The present invention relates to a semiconductor manufacturing technology; and, more particularly, to a method for manufacturing a semiconductor device for forming a landing plug.

As a semiconductor device is highly integrated, a landing plug process is generally performed before a contact process for securing sufficient process margin when forming a storage node contact plug of a bit line or capacitor.

Currently, in order to compensate for a thickness of a gate hard mask nitride layer in a landing plug contact (LPC) process of a 90-nm device, a buffer layer with poor step coverage is deposited with a predetermined thickness after etching the landing plug contact conventionally.

FIGS. 1A and 1B are sectional views illustrating a method for manufacturing a conventional semiconductor device.

Referring to FIG. 1A, a plurality of gate lines G are formed on a predetermined region of a substrate 11. Each of the gate lines G is configured with a gate insulating layer 12, a gate polysilicon layer 13, a gate tungsten silicide layer 14, and a gate hard mask nitride layer 15, which are stacked on the substrate 11 in sequence.

Thereafter, a gate spacer 16 and a cell spacer nitride layer 17 are deposited on the gate line G and the substrate 11.

Subsequently, after depositing an interlayer insulating layer 18 on the entire surface of the substrate 11 having the gate line G, an etching process for the landing plug contact is carried out to thereby form a contact hole 19 that opens respective areas over first and second junction regions A and B to be connected to a bit line contact (not shown) and a storage node contact (not shown), respectively.

Afterwards, a buffer oxide layer 20 with poor step coverage is deposited on the gate line G and the surface of the contact hole 19. For instance, the buffer oxide layer 20 is formed such that the buffer oxide layer 20 formed on the substrate 1 and sidewalls of the gate line G is formed thinly, whereas the buffer oxide layer 20 formed on the gate line G is relatively thick.

Next, referring to FIG. 1B, a cleaning process is performed to remove the buffer oxide layer 20 formed on the bottom surface of the contact hole 19, and thereafter, an etch-back process is performed on the buffer oxide layer 20 so as to open the first and second junction regions A and B.

However, according to the conventional method, since the cell spacer nitride layer 17 ad the gate spacer 16 are etched under the condition that an etch selectivity ratio between the oxide layer and the nitride layer is 1:1 in the etch-back process, a portion of the gate hard mask nitride layer 15 of the gate line G is simultaneously removed during the etch-back process, which is represented as X in FIG. 1B. This leads to a problem that a self-aligned contact margin decreases due to the etch loss of the gate hard mask nitride layer 15.

SUMMARY OF THE INVENTION

It is, therefore, an object of the present invention to provide a method for manufacturing a semiconductor device adaptive for increasing a self-aligned contact margin by reducing an etch loss of a gate hard mask nitride layer as well as securing an open margin of a contact hole, in etching process of a landing plug contact.

In accordance with an aspect of the present invention, there is provided a method for manufacturing a semiconductor device, the method including: forming a plurality of gate lines on a substrate; forming a first cell spacer on the gate lines; forming a second cell spacer on the first cell spacer; forming a buffer layer on the second cell spacer; and exposing the surface of the substrate by etching the buffer layer.

In accordance with another aspect of the present invention, there is provided a method for manufacturing a semiconductor device, the method including: forming a plurality of gate lines on a substrate; forming a first cell spacer on the gate lines; forming an insulation layer over the first cell spacer; etching the insulation layer to form a contact hole opening top portions of the gate lines and bottom portions between the neighboring gate lines; forming a second cell spacer on a resultant structure obtained after etching the insulation layer; forming a buffer layer on the second cell spacer; and etching the buffer layer, the second cell spacer and the first cell spacer to expose the surface of the substrate between the gate lines.

DETAILED DESCRIPTION OF SPECIFIC EMBODIMENTS

A method for manufacturing semiconductor device in accordance with exemplary embodiments of the present invention will be described in detail with reference to the accompanying drawings.

FIGS. 2A to 2E are sectional views illustrating a method for manufacturing a semiconductor device in accordance with an embodiment of the present invention.

Figure 1A:
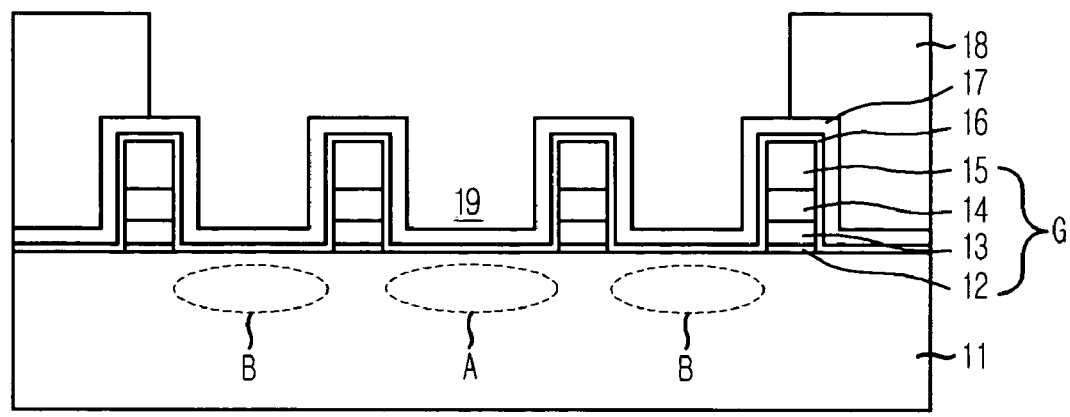
FIGS. 1A and 1B are sectional views illustrating a method for manufacturing a conventional semiconductor device.
Figure 1B:
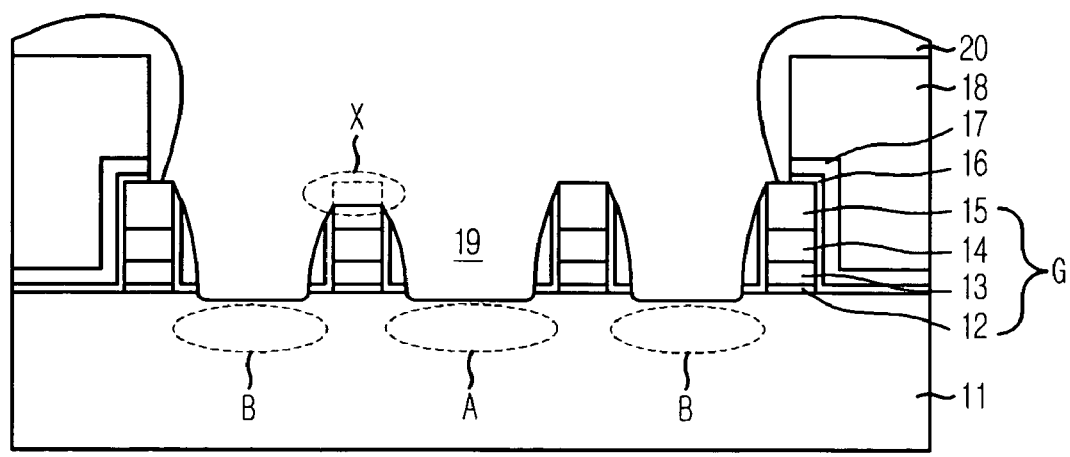
Figure 2A:
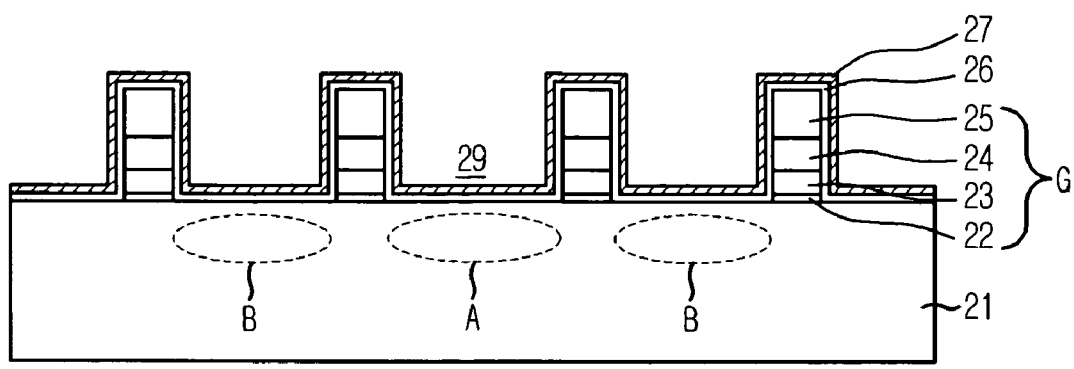
FIGS. 2A to 2E are sectional views illustrating a method for manufacturing a semiconductor device in accordance with an embodiment of the present invention.

Referring to FIG. 2A, a plurality of gate lines G are formed on a certain region of a substrate 21. Each of the gate lines G includes a gate insulating layer 22, a gate polysilicon layer 23, a gate tungsten silicide layer 24, and a gate hard mask nitride layer 25, which are stacked on the substrate 21. A silicon oxynitride (SiON) layer may be deposited on the gate hard mask layer 25 as an anti reflective coating layer.

A gate spacer 26 and a first cell spacer nitride layer 27 are deposited on the gate lines G and the substrate 11. The gate spacer 26 has a multi-stacked structure of an oxide layer and a nitride layer. Herein, the first cell spacer nitride layer 27 acting as a barrier in etching process for a self-aligned contact has excellent step coverage, and is deposited with a thickness of 100 Å For example, when depositing the first cell spacer nitride layer 27 of which a target thickness is approximately 100 Å it should be deposited with a thickness in a range of approximately 90 Å to 95 Å on the sidewalls of the gate lines G and the surface of the substrate 21, and deposited with a thickness in a range of approximately 95 Å to 100 Å on the gate lines G. That is, there is little thickness difference when depositing the first cell spacer nitride layer 27 on the gate lines G.

Figure 2B:
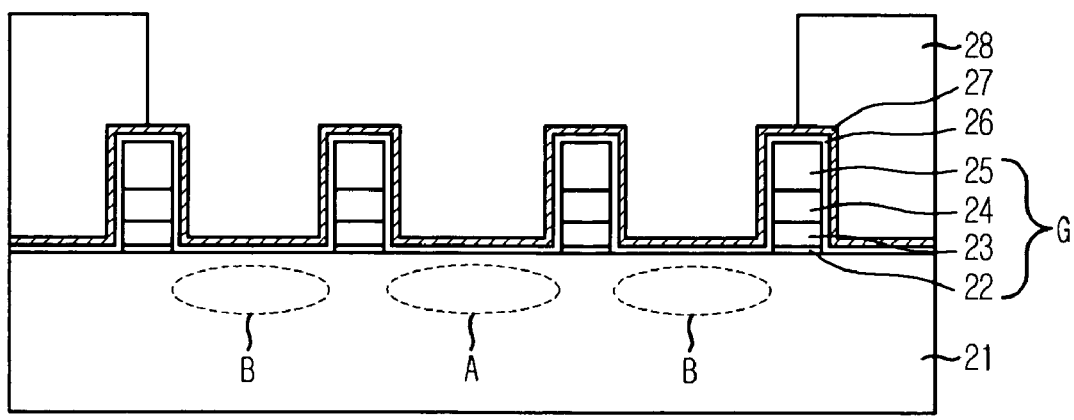

Referring to FIG. 2B, after depositing an interlayer insulating layer 28 on the above resultant structure illustrated in FIG. 2A, an etching process for a landing plug contact is carried out using self-aligned contact etch to thereby form a contact hole 29 that opens respective areas over first and second junction regions A and B to be connected to a bit line contact (not shown) and a storage node contact (not shown), respectively. At this time, the gate spacer 26 and the first cell spacer nitride layer 27 remain on the bottom surface of the contact hole 29. By means of the contact hole 29, the plurality of gate lines G are opened at the same time.

Figure 2C:
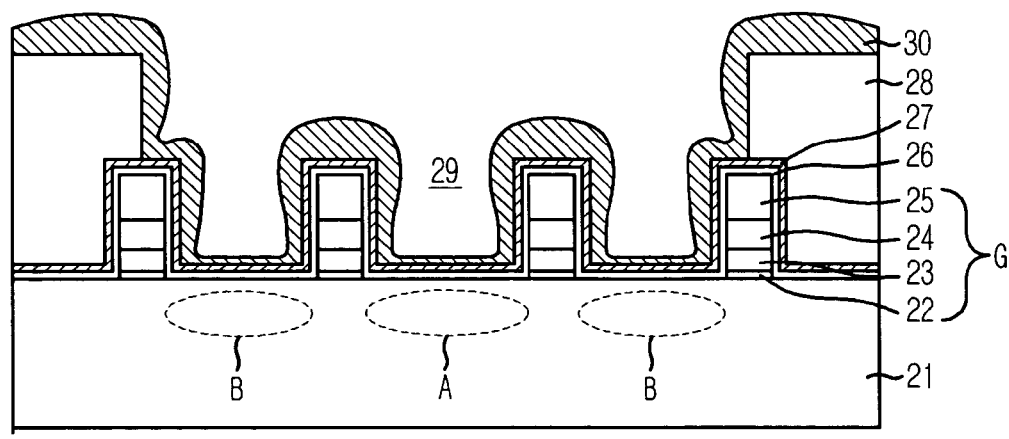

Referring to FIG. 2C, a second spacer nitride layer 30 is deposited on the gate lines G and the surface of the contact hole 29. The second spacer nitride layer 30 is formed such that it has poor step coverage. In detail, the second spacer nitride layer 30 is formed thinly on the surface of the substrate 21 and the sidewalls of the gate lines G, whereas the second spacer nitride layer 30 formed on the gate lines G is relatively thicker than the aforementioned portions.

The step coverage of the second spacer nitride layer 30 may be adjusted according to recipe. That is, a mixed gas of $N_2/SiH_4/NH_3$ flows at flow rate in range of approximately 1-2 slm, approximately 0.2-0.6 slm, and approximately 2-5 slm, respectively, at a low temperature in range of approximately 200° C. to 400° C. so that silicon oxynitride ($Si_3N_4$) with poor step coverage is deposited. In particular, if the deposition temperature among various process parameters is set to be low, the step coverage becomes poorer. For reference, the first cell spacer nitride layer 27 is deposited at a high temperature beyond approximately 400° C. so that it has excellent step coverage. Herein, the excellent step coverage means that a layer is deposited conformally on a resultant structure. For example, when the first cell spacer nitride layer 27 of which a target thickness is approximately 100 Å is to be deposited, the first cell spacer nitride layer 27 is deposited with a thickness in a range of approximately 90 Å to 95 Å on the sidewalls of the gate lines G and the surface of the substrate 21, and deposited with a thickness in a range of approximately 95 Å to 100 Å on the gate lines G.

On the contrary, the poor step coverage means that a layer is deposited unevenly on the resultant structure. For example, the second spacer nitride layer 30 is deposited with a thickness in a range of approximately 80 to 90 Å on the sidewalls of the gate lines G and the surface of the substrate 21, but it is deposited with a thickness in a range of approximately 95 to 100 Å on the gate lines G, when depositing the second spacer nitride layer 30 of which a target thickness is approximately 100 Å In the embodiment of the present invention, when a thickness ratio of the second spacer nitride layer 30 on the surface of the substrate 21 and the sidewalls of the gate lines G to the second spacer nitride layer 30 on the gate lines G is set at approximately 0.8-0.9:0.95-1, the second spacer nitride layer 30 can be formed thickly on the gate lines G.

Thus, by forming the second spacer nitride layer 30 thicker on the top surface of the gate lines G than on the sidewalls of the gate lines G, it is possible to prevent the etch loss of the gate hard mask nitride layer 25 formed on the gate lines G during a follow-up etch-back process.

In the embodiment of the present invention, the cell spacer nitride layer is deposited twice, i.e., a first time for the first cell spacer nitride layer 27 and a second time for the second cell spacer nitride layer 30, such that the first cell spacer nitride layer 27 is formed with good step coverage but the second cell spacer nitride layer 30 is formed with poor step coverage.

Accordingly, the cell spacer nitride layer is formed thickly on the surface of the substrate 21, whereas it is formed thinly on the gate lines G. Since the cell spacer nitride layer is formed such that it has poor step coverage, it is possible to compensate for the etch loss of the nitride layer on the gate lines G, which may be partially removed in follow-up etching process of a buffer layer (e.g., an oxide layer). As a result, the nitride layer, e.g., the gate hard mask nitride layer 25, can be maintained to have sufficient thickness, which increases an etch margin for self-aligned contact.

When depositing the second cell spacer nitride layer 30 with poor step coverage, it is easy to secure gap-fill margin because the thickness of the first cell spacer nitride layer 27 can be reduced, and further it is possible to increase contact open margin in the etching process for landing plug contact.

Figure 2D:
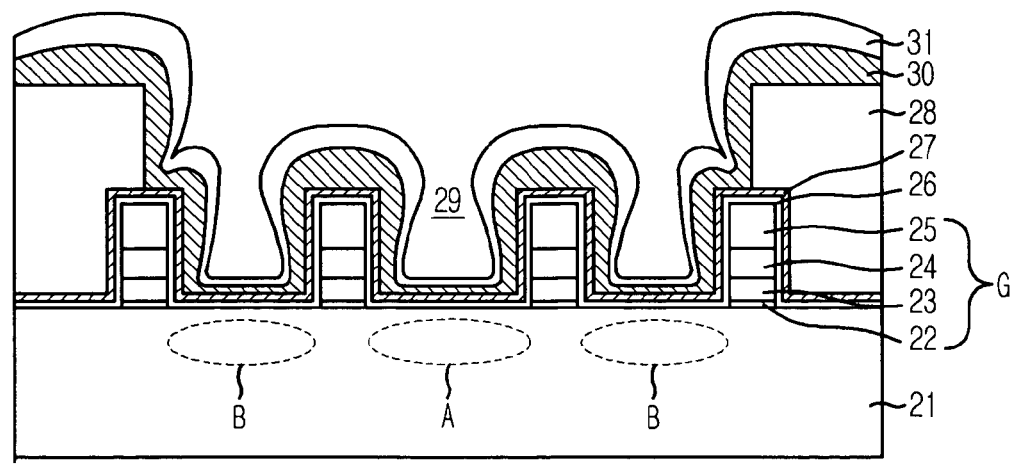

Referring to FIG. 2D, a buffer layer 31 is formed on the second spacer nitride layer 30. Herein, the buffer layer 31 is formed of an oxide-based material. Also, the buffer layer 31 is formed of undoped silicate glass (USG) so that its step coverage becomes poor. That is, the buffer layer 31 is formed thinly on the surface of the substrate 21 and the sidewalls of the gate lines G, whereas it is formed thickly over the gate lines G.

In virtue of the buffer layer 31 having the poor step coverage, it is possible to compensate for the etch loss of the gate hard mask layer 25 in a follow-up etch-back process for opening first and second junction regions A and B.

Figure 2E:
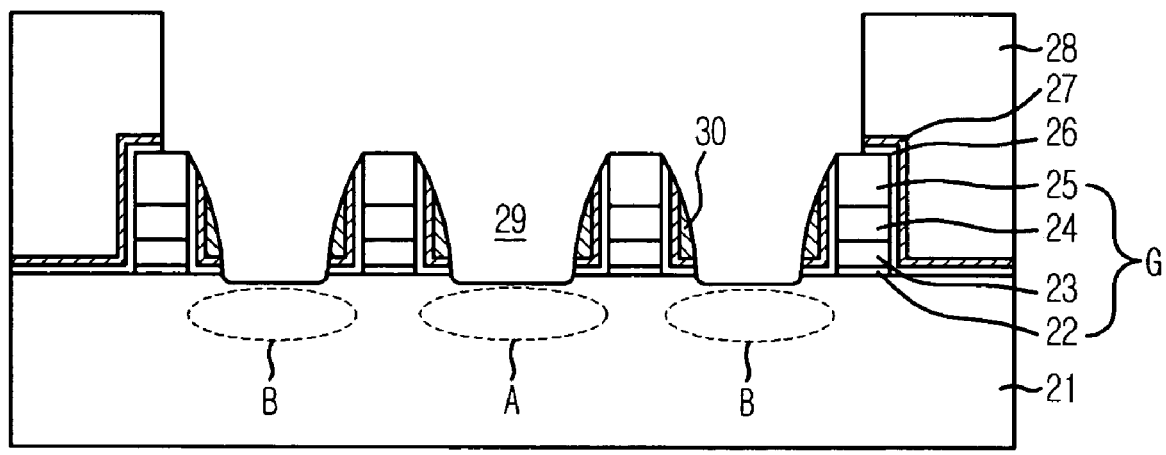

Referring to FIG. 2E, the buffer layer 31 between the gate lines G is removed through a cleaning process. Therefore, the buffer layer 31 remains only on the sidewalls and top surface of the gate lines G.

Subsequently, an etch-back process is performed on the buffer layer 31 so as to expose the first and second junction regions A and B of the substrate 21. Herein, an etch selectivity ratio between the oxide layer and the nitride layer is set at approximately 1:1 in the etch-back process. Thus, during the etch-back process of the buffer layer 31, the second and first cell spacer nitride layers 30 and 27, and the gate spacer 26 disposed between the gate lines G are simultaneously etched, exposing the first and second junction regions A and B. After the etch-back process, the buffer layer 31 may not remain.

As the first and second cell spacer nitride layers 27 and 30 are deposited thicker on the top surface of the gate lines G than on the surface of the substrate 21, an etch target for exposing the surface of the substrate 21 can be reduced in the etch-back process. Accordingly, as the etch target is reduced, the etch loss of the gate hard mask nitride layer 25 on the top surface of the gate lines G may be reduced, so that it is possible to increase the thickness of the remaining gate hard mask nitride layer 25 on the gate lines G resultantly.

In particular, since the second cell spacer nitride layer 30 makes up for the etch loss of the gate hard mask layer 25, which is insufficient in case of only using the buffer layer 31, the etch loss of the gate hard mask nitride layer 25 may be less.

In accordance with the embodiment, because the cell spacer nitride layer is deposited such that it has poor step coverage, the etch target can be reduced in the etch-back process so that it is possible to minimize the etch loss of the gate hard mask nitride layer.

As a result, the thickness of the remaining gate hard mask nitride layer over the gate lines may be increased so that it is possible to increase the self-aligned contact margin correspondingly.

In conclusion, in accordance with present invention as described above, the cell spacer nitride layer with poor step coverage is formed such that the cell spacer nitride layer is formed thicker on the top surface of the gate line G than on the surface of the substrate and the sidewalls of the gate line. Therefore, the exemplary embodiment of the present invention provides an advantageous effect of compensating for the etch loss of the gate hard mask nitride formed on the top surface and sidewalls of the gate line during the etching of the buffer layer.

Resultantly, it is possible to improve the reliability of semiconductor device with the increase of the self-aligned contact process margin.

While the present invention has been described with respect to certain preferred embodiments, it will be apparent to those skilled in the art that various changes and modifications may be made without departing from the spirit and scope of the invention as defined in the following claims.

What is claimed is:

1. A method for manufacturing a semiconductor device comprising:
    forming a plurality of gate lines on a substrate;
    forming a gate spacer on the gate lines;
    forming a first cell spacer on the gate spacer;
    forming an insulation layer over the first cell spacer;
    etching the insulation layer to form a contact hole opening top portions of the first gate spacer and bottom portions of the first gate spacer between the neighboring gate lines;
    forming a second cell spacer on a resultant structure obtained after etching the insulation layer;
    forming a buffer layer on the second cell spacer; and
    etching the buffer layer, the second cell spacer and the first cell spacer to expose the surface of the substrate between the gate lines,
    wherein the first cell spacer is conformally formed on the gate spacer, gate lines and the substrate, and the second cell spacer is formed thinner on the surface of the substrate and sidewalls of the gate spacer than on the top surface of the gate spacer.

2. The method of claim 1, wherein a thickness ratio between the second cell spacer on the surface of the substrate and the sidewalls of the gate spacer and the second cell spacer on the top surface of the gate spacer is set at approximately 0.8-0.9:0.95-1.

3. The method of claim 1, wherein the first and second cell spacers include substantially the same material.

4. The method of 3, wherein the first and second cell spacers include a nitride-based material.

5. The method of claim 4, wherein the second cell spacer is formed at a low temperature in a range of approximately 200° C. to 400° C.

6. The method of claim 5, wherein the second cell spacer is formed using $N_2$, $SiH_4$ and $NH_3$ gases.

7. The method of claim 6, wherein the $N_2$, $SiH_4$ and $NH_3$ gases flow at flow rates in a range of approximately 1-2 slm, approximately 0.2-0.6 slm, and approximately 2-5 slm, respectively.

8. The method of claim 1, wherein the buffer layer is formed thicker on the top surface than on sidewalls of the gate spacer.

9. The method of claim 8, wherein the buffer layer includes an oxide-based material.

10. The method of claim 9, wherein the buffer layer includes undoped silicate glass (USG).

11. The method of claim 1, wherein the etching of the buffer layer, the second cell spacer and the first cell spacer proceeds with employing an etch-back process in a condition that a ratio of an etch selectivity of the buffer layer to the etch selectivity of each of the first and second cell spacers is approximately 1:1.

* * * * *